United States Patent
Lee et al.

(10) Patent No.: US 7,675,365 B2
(45) Date of Patent: Mar. 9, 2010

(54) SYSTEMS AND METHODS FOR POWER AMPLIFIERS WITH VOLTAGE BOOSTING MULTI-PRIMARY TRANSFORMERS

(75) Inventors: Chang-Ho Lee, Marietta, GA (US); Kyu Hwan An, Dunwoody, GA (US); Ki Seok Yang, Atlanta, GA (US); Jaejoon Chang, Duluth, GA (US); Wangmyong Woo, Cumming, GA (US); Younsuk Kim, Suwon (KR); Haksun Kim, Daejeon (KR); Ockgoo Lee, Atlanta, GA (US); Dong Ho Lee, Atlanta, GA (US); Hyungwook Kim, Atlanta, GA (US); Joy Laskar, Marietta, GA (US)

(73) Assignees: Samsung Electro-Mechanics (KR); Georgia Tech Research Corporation, Atlanta, GA (US)

( * ) Notice: Subject to any disclaimer, the term of this patent is extended or adjusted under 35 U.S.C. 154(b) by 1 day.

(21) Appl. No.: 11/964,646

(22) Filed: Dec. 26, 2007

(65) Prior Publication Data

US 2008/0164941 A1    Jul. 10, 2008

Related U.S. Application Data

(60) Provisional application No. 60/884,374, filed on Jan. 10, 2007.

(51) Int. Cl.
 H03F 3/68 (2006.01)
 H03F 1/00 (2006.01)
(52) U.S. Cl. ........................ 330/295; 330/195
(58) Field of Classification Search ............. 330/124 R, 330/195, 197, 65, 295
See application file for complete search history.

(56) References Cited

U.S. PATENT DOCUMENTS

| | | | | |
|---|---|---|---|---|
| 3,060,266 A | * | 10/1962 | Dow | ............................ 381/27 |
| 4,105,941 A | | 8/1978 | Routh | |
| 6,323,686 B1 | * | 11/2001 | Bisson et al. | .................. 326/82 |
| 6,476,704 B2 | * | 11/2002 | Goff | ............................ 336/200 |
| 7,129,784 B2 | | 10/2006 | Bhatti et al. | |
| 2007/0046371 A1 | | 3/2007 | Barabash et al. | |
| 2007/0069717 A1 | | 3/2007 | Cheung et al. | |

FOREIGN PATENT DOCUMENTS

| EP | 1677415 A1 | 5/2006 |
|---|---|---|
| JP | 2003506915 A | 2/2003 |
| WO | 0110053 A1 | 2/2001 |

OTHER PUBLICATIONS

Search Report for GB 0800400.4, dated Mar. 18, 2008.

* cited by examiner

*Primary Examiner*—Robert Pascal
*Assistant Examiner*—Khiem D Nguyen
(74) *Attorney, Agent, or Firm*—Sutherland Asbill & Brennan LLP

(57) ABSTRACT

Systems and methods may be provided for a power amplifier system. The systems and methods may include a plurality of power amplifiers, where each power amplifier includes at least one output port. The systems and methods may also include a plurality of primary windings each having a first number of turns, where each primary winding is connected to at least one output port of the plurality of power amplifiers, and a single secondary winding inductively coupled to the plurality of primary windings, where the secondary winding includes a second number of turns greater than the first number of turns.

21 Claims, 18 Drawing Sheets

SYSTEMS AND METHODS FOR POWER AMPLIFIERS WITH VOLTAGE BOOSTING MULTI-PRIMARY TRANSFORMERS

RELATED APPLICATION

The present application claims priority to U.S. Provisional Application No. 60/884,374, filed Jan. 10, 2007, and entitled "SYSTEMS AND METHODS FOR RADIO FREQUENCY (RF) POWER AMPLIFIERS WITH VOLTAGE BOOSTING MULTI-PRIMARY TRANSFORMERS," which is hereby incorporated by reference in its entirety as if fully set forth herein.

FIELD OF INVENTION

Embodiments of the invention relate generally to power amplifiers, and more particularly, to systems and methods for voltage-boosting transformers to couple one or more power amplifiers to a load.

BACKGROUND OF THE INVENTION

With the explosive growth of the mobile communications industry, many efforts have been made to integrate mobile application functions (e.g., low noise amplifiers, mixers, voltage-controlled oscillators, etc.) into a single semiconductor technology (e.g., a single chip). However, fully integrating a power amplifier on a single chip area presents a variety of difficulties. In particular, bulky power matching structures require a large chip area and if the matching structure is distributed on the whole chip area, then the high output power from the power amplifier can degrade the performance of other mobile application functions. Therefore, in some applications, the matching structure of power amplifiers should be isolated from other mobile application functions into one area and the total matching structure size should be reasonably small to be cost effective while the level of output power is high enough. Accordingly, there is a need for improved power matching designs to implement a fully integrated high-power amplifier system.

BRIEF SUMMARY OF THE INVENTION

According to an example embodiment of the invention, there is a power amplifier system. The power amplifier system may include a plurality of power amplifiers, where each power amplifier includes at least one output port. The power amplifier system may also include a plurality of primary windings each having a first number of turns, where each primary winding is connected to at least one output port of the plurality of power amplifiers, and a single secondary winding inductively coupled to the plurality of primary windings, where the secondary winding includes a second number of turns greater than the first number of turns.

According to another example embodiment of the invention, there is a method for providing a power amplifier system. The method may include providing a plurality of power amplifiers, where each power amplifier includes at least one output port. The method may also include connecting the at least one output port of each power amplifier to one of a plurality of primary windings, where each of the plurality of windings includes a first number of turns, and inductively coupling the plurality of primary windings to a single secondary winding, where the secondary winding includes a second number of turns greater than the first number of turns.

BRIEF DESCRIPTION OF THE DRAWINGS

Figure 1A:
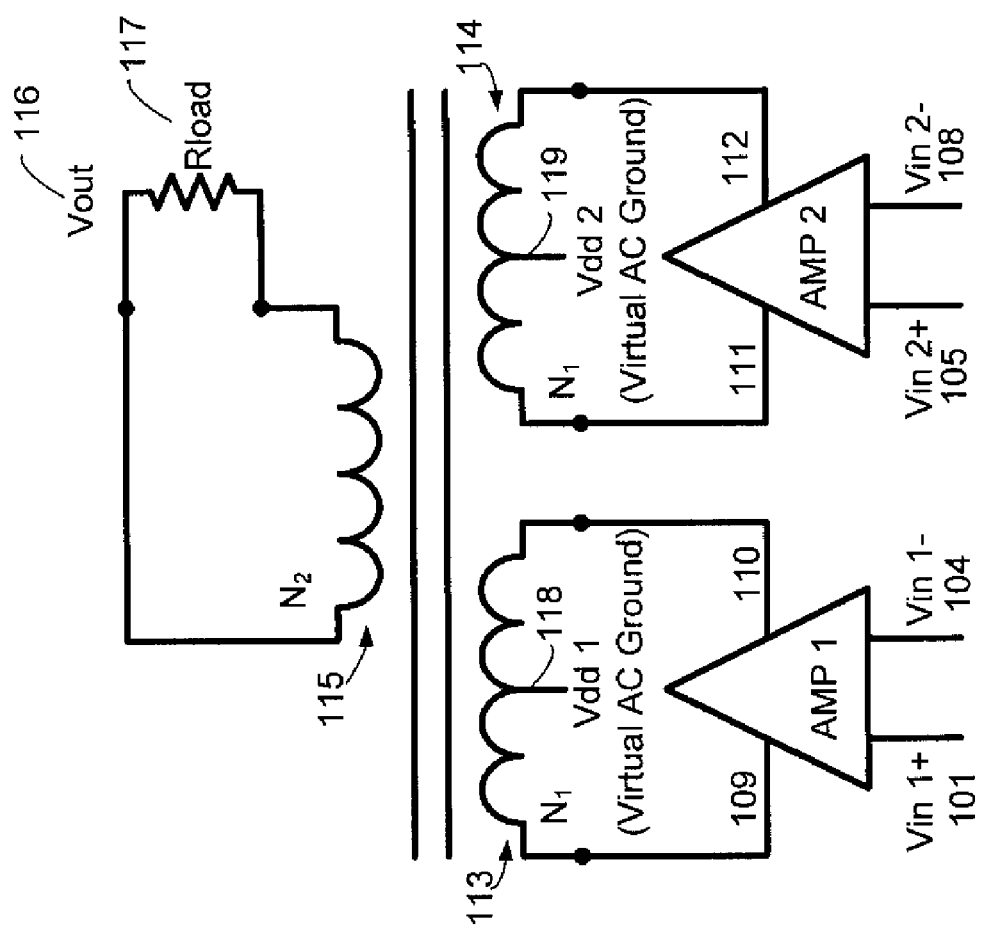

Having thus described the invention in general terms, reference will now be made to the accompanying drawings, which are not necessarily drawn to scale, and wherein:

FIG. 1A illustrates a circuit diagram of a voltage-boosting transformer in accordance with an example embodiment of the invention.

Figure 1B:
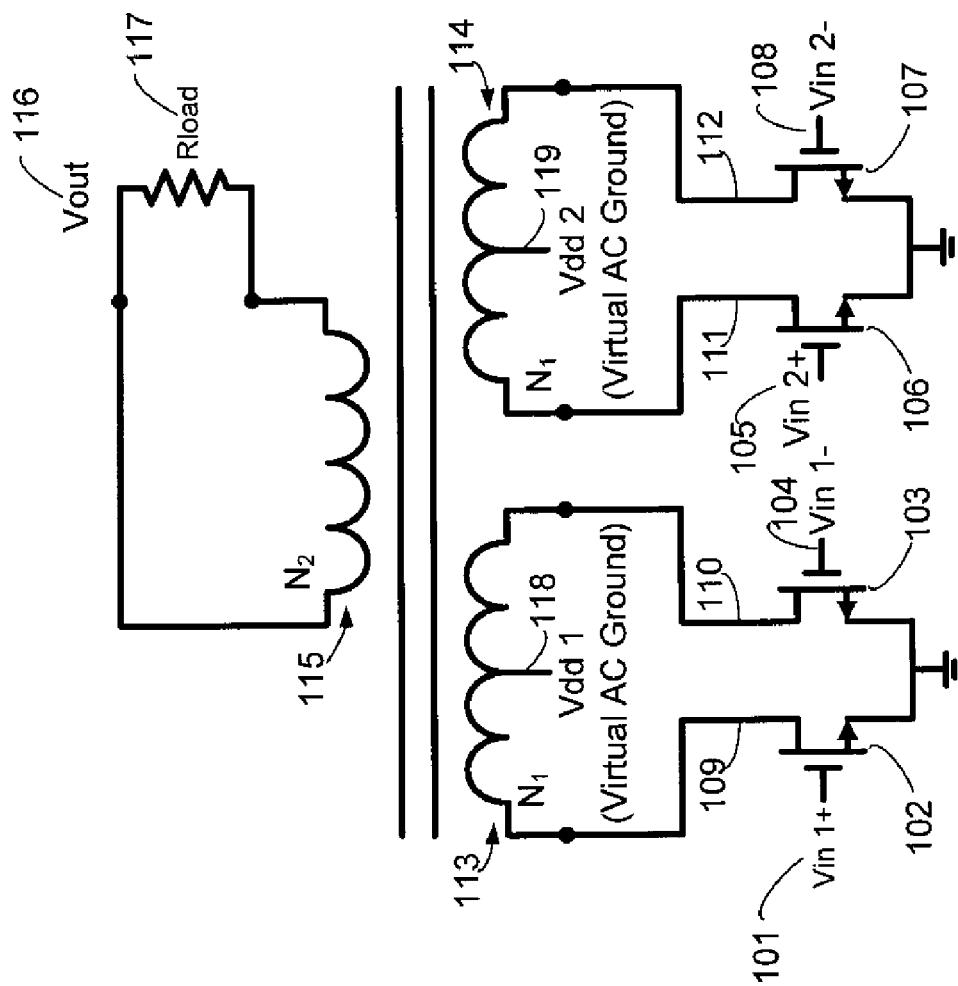

FIG. 1B illustrates a voltage-boosting transformer of that is utilized with differential amplifiers, according to an example embodiment of the invention.

Figure 2A:
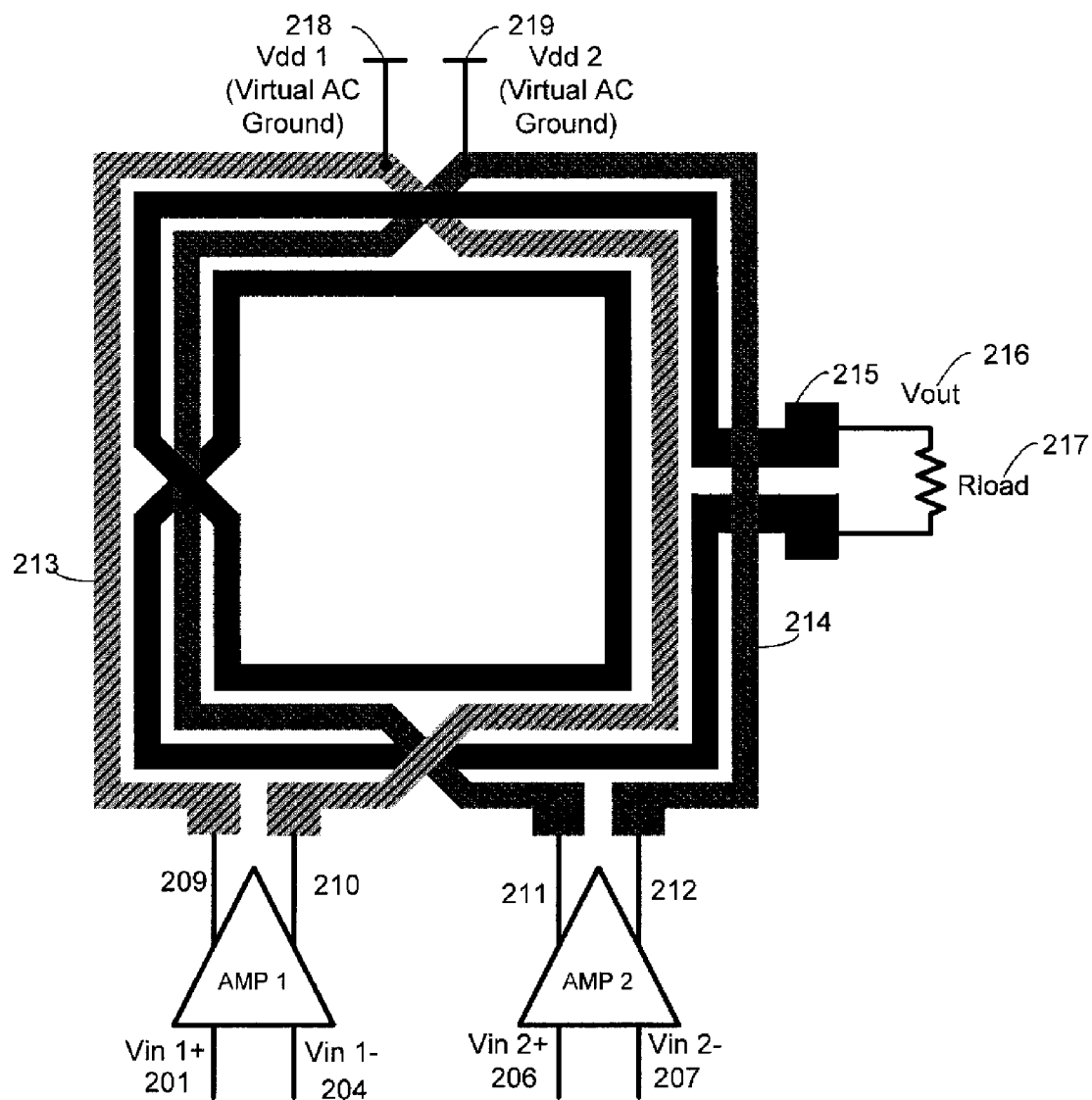

FIG. 2A illustrates an example layout structure for an example transformer, according to an example embodiment of the invention.

Figure 2B:
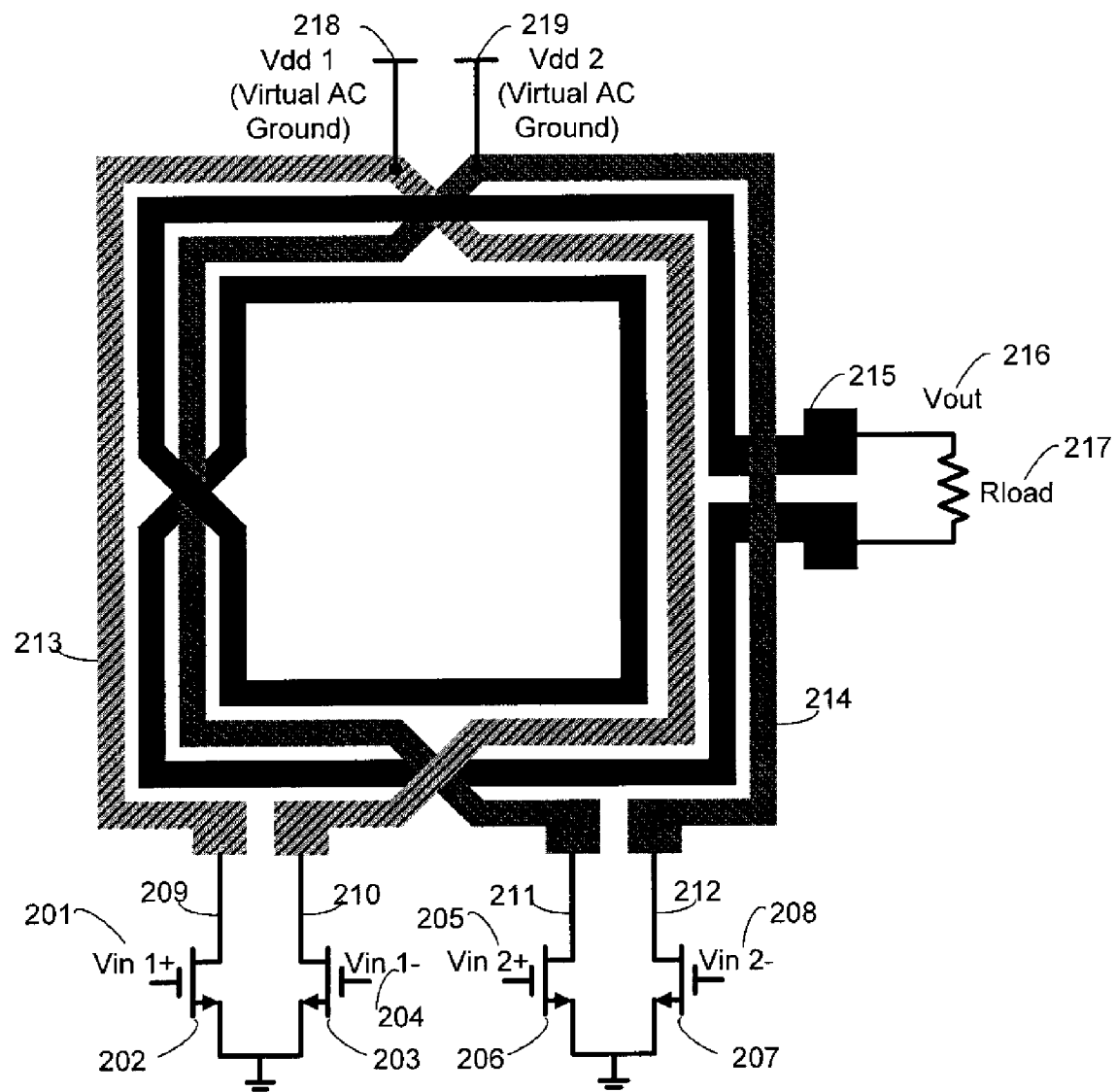

FIG. 2B illustrates an example layout structure for an example transformer that may be utilized with differential amplifiers, according to an example embodiment of the invention.

Figure 3:
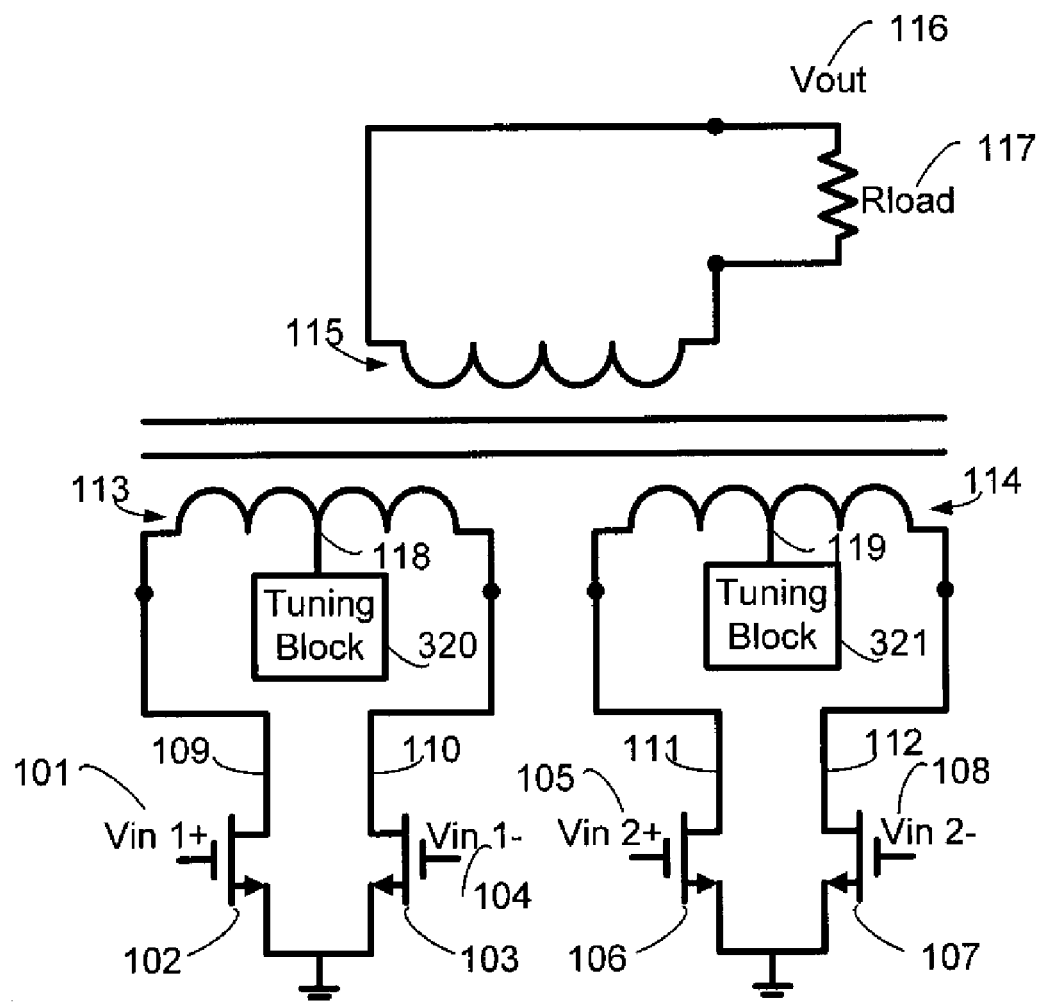

FIG. 3 illustrates a circuit diagram of the example transformer that utilizes one or more tuning blocks, according to an example embodiment of the invention.

Figure 4:
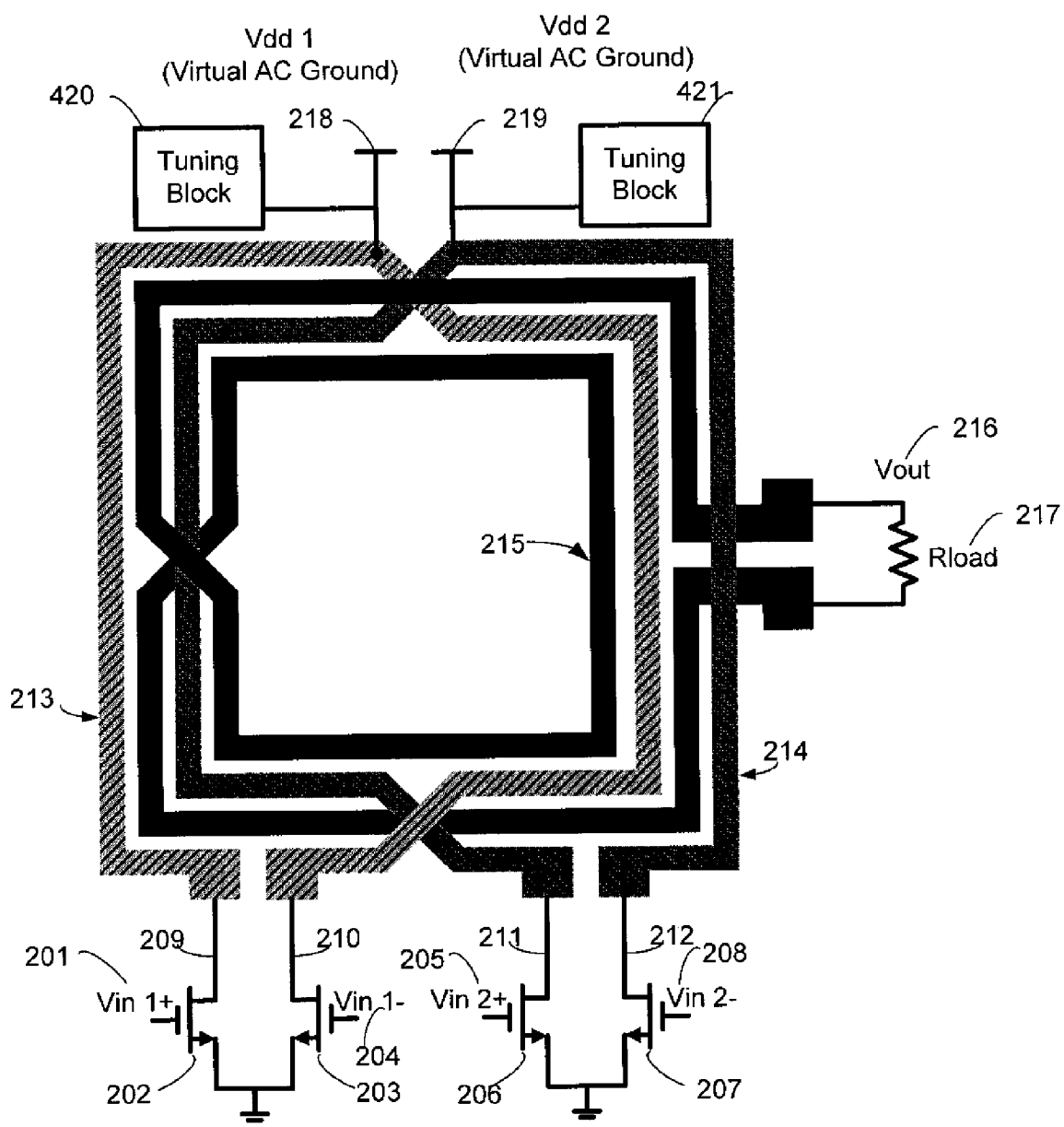

FIG. 4 illustrates an example layout structure for an example transformer utilizing one or more tuning blocks, according to an example embodiment of the invention.

Figure 5C:
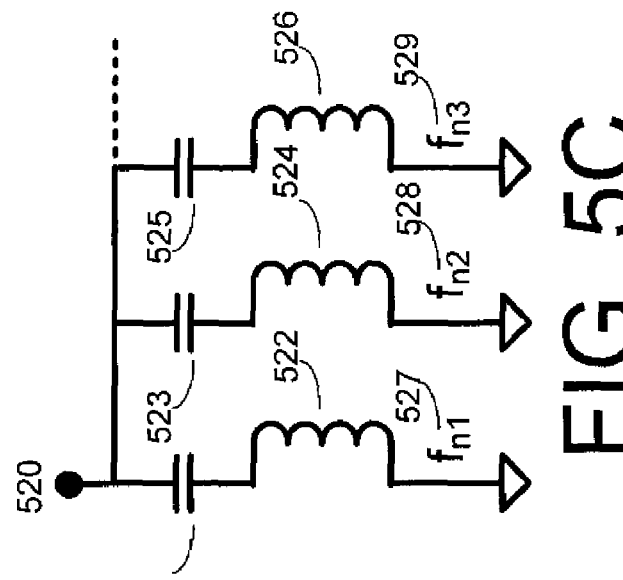
Figure 5B:
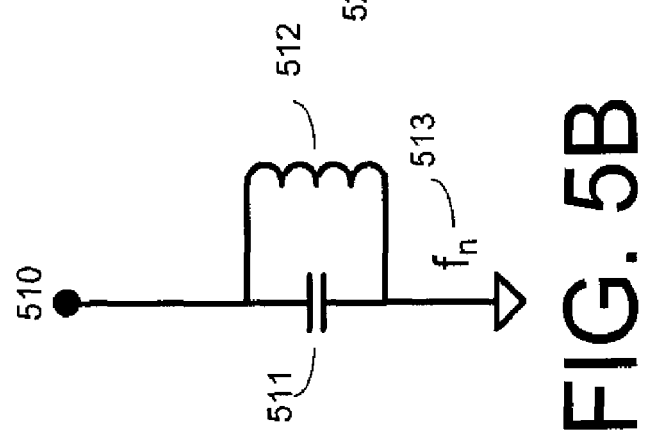
Figure 5A:
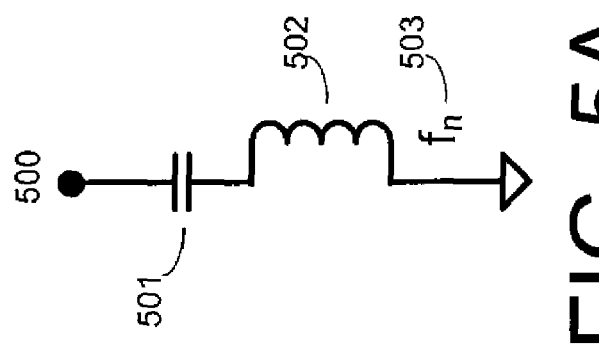

FIG. 5A is a schematic diagram of an example tuning block, according to an example embodiment of the invention.

FIG. 5B illustrates another schematic diagram of an example tuning block, according to an example embodiment of the invention.

FIG. 5C illustrates another schematic diagram of an example tuning block, according to an example embodiment of the invention.

Figure 6A:
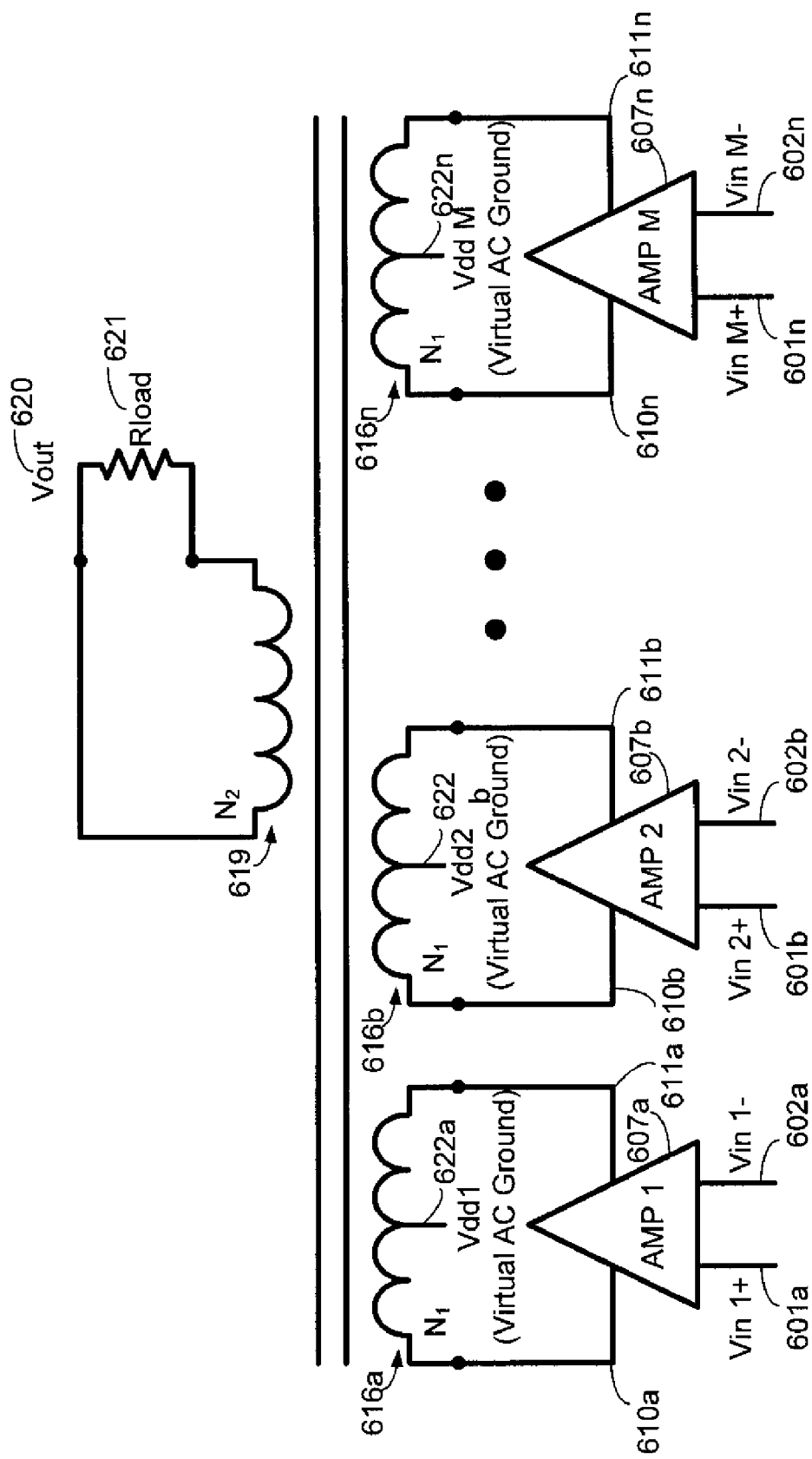

FIG. 6A illustrates an example embodiment of the invention in which a plurality of primary windings may be coupled to a single secondary winding.

Figure 6B:
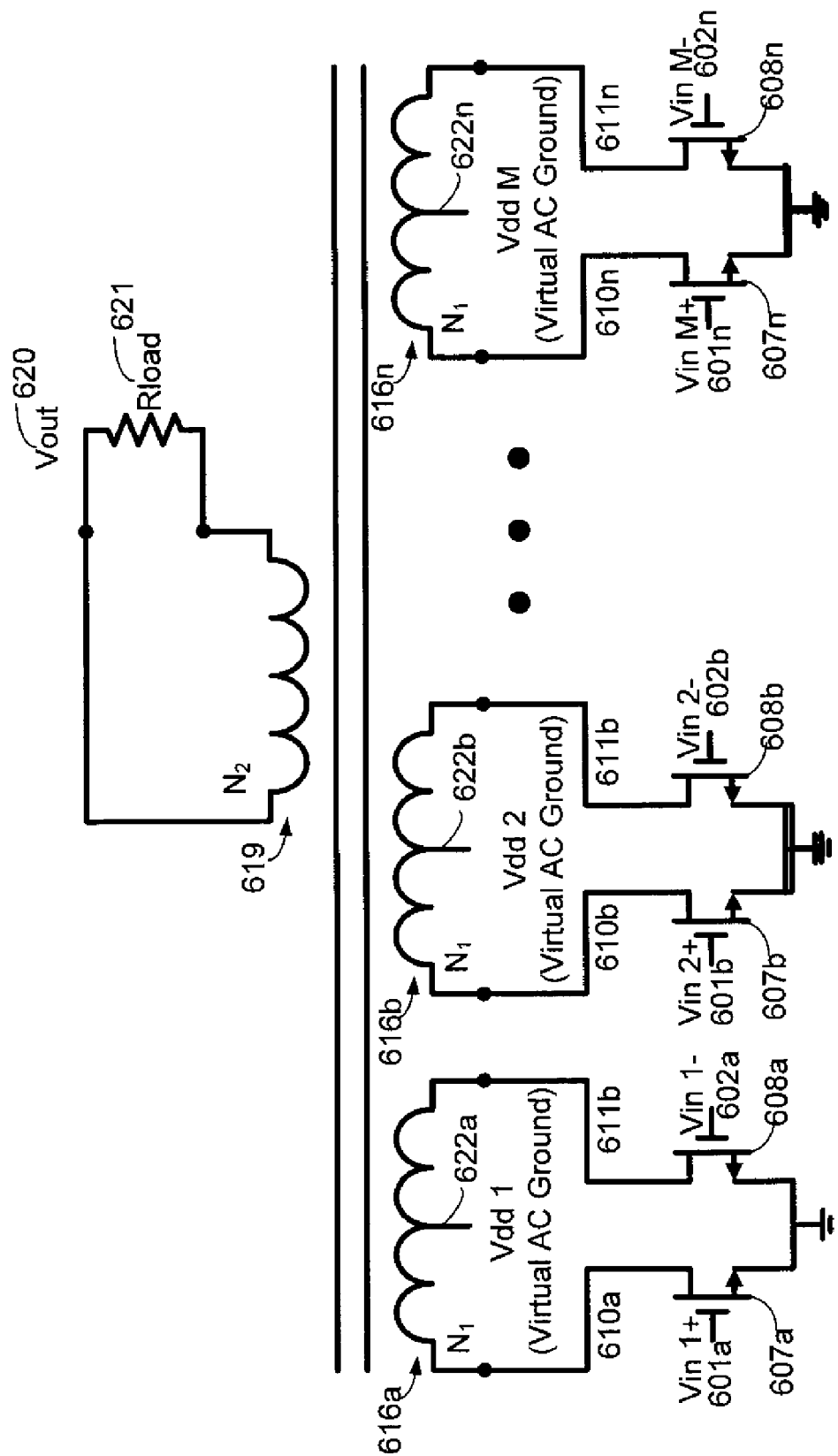

FIG. 6B illustrates an example embodiment of the invention in which a plurality of primary windings may be coupled to a single secondary winding.

Figure 7:
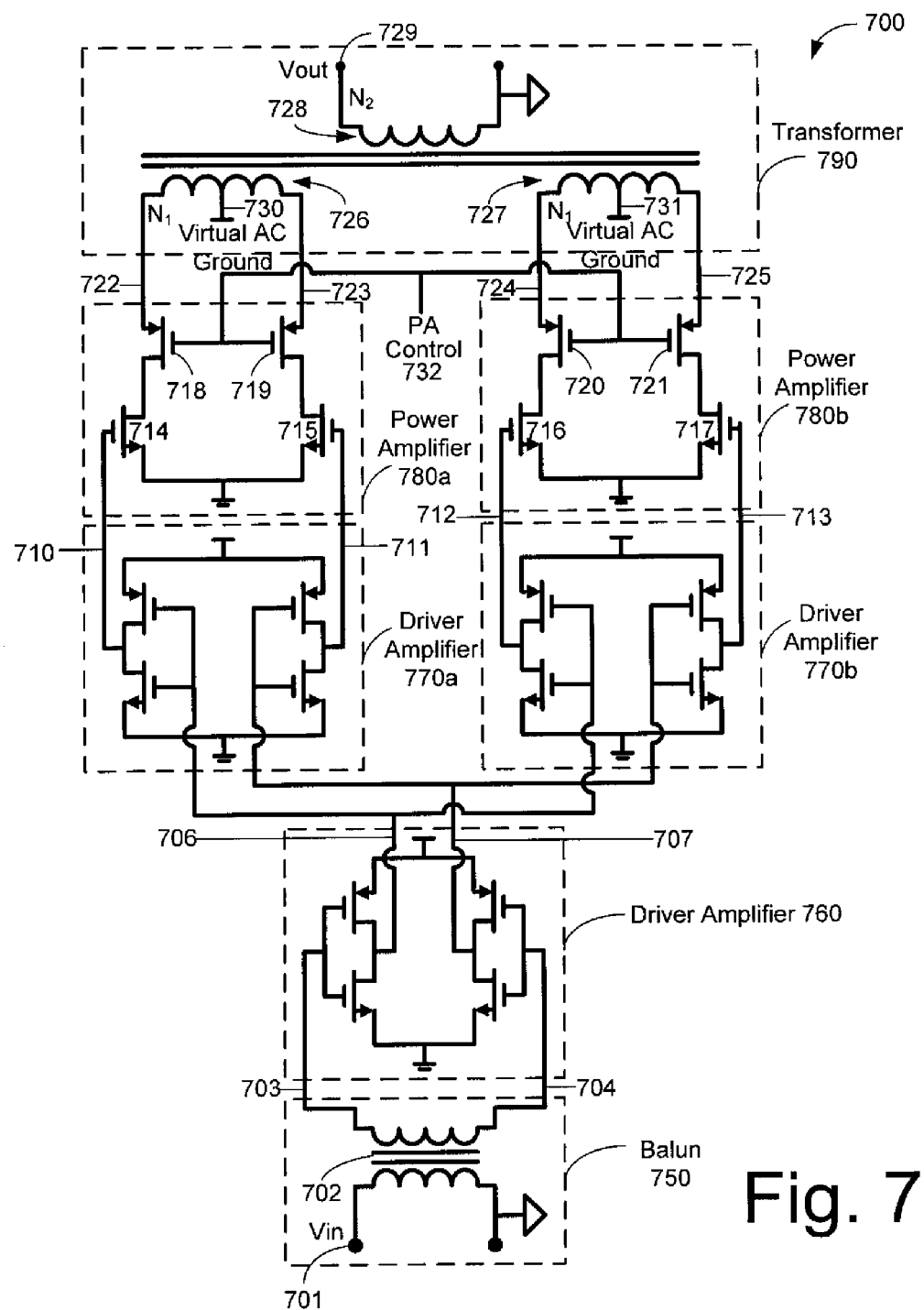

FIG. 7 illustrates a power amplifier system that includes a transformer in accordance with an example embodiment of the invention.

Figure 8:
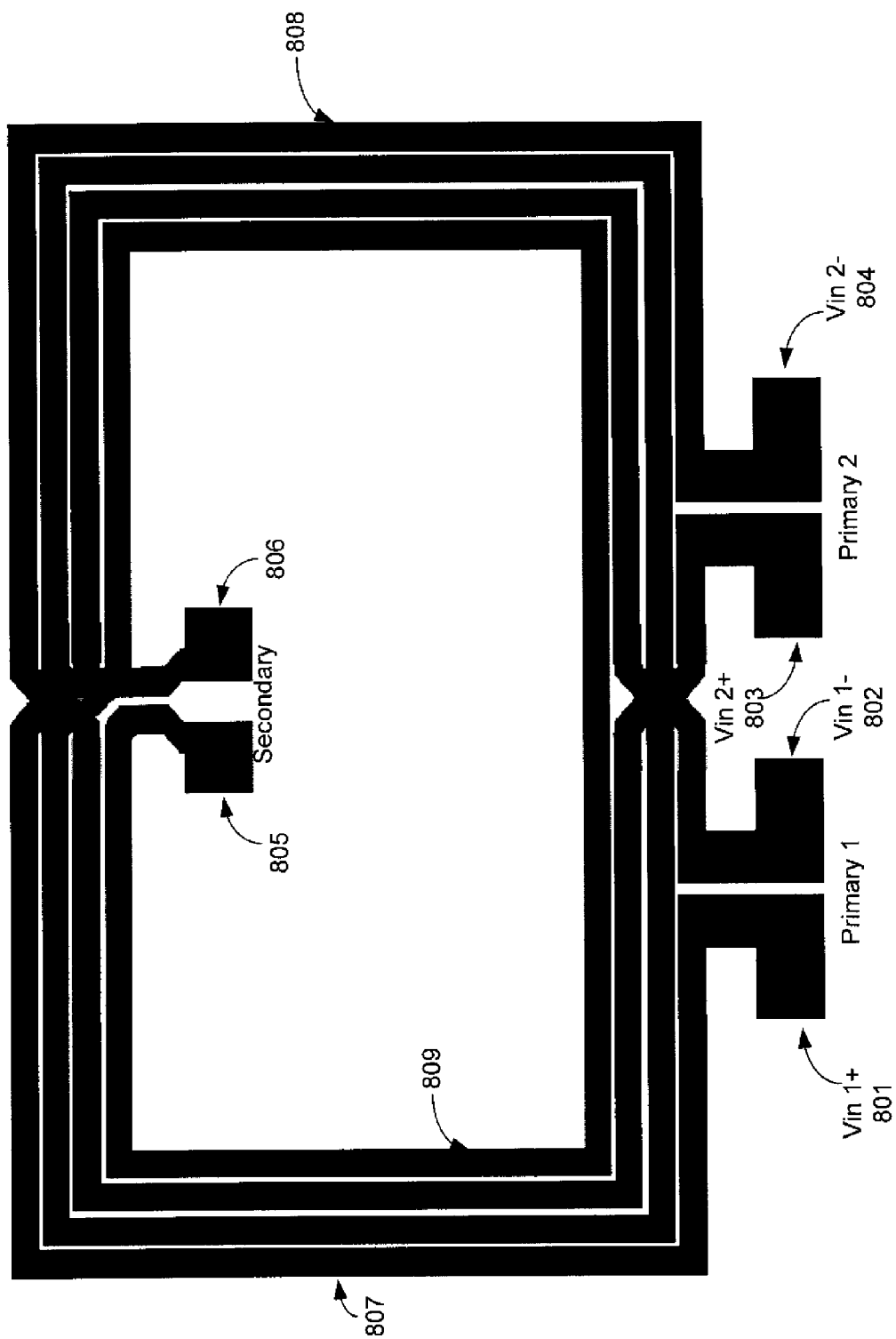

FIG. 8 is a example layout structure of an example transformer using two primary windings and a single secondary winding with the turn ratio from one primary winding to the single secondary winding being 1:2, according to an example embodiment of the invention.

Figure 9:
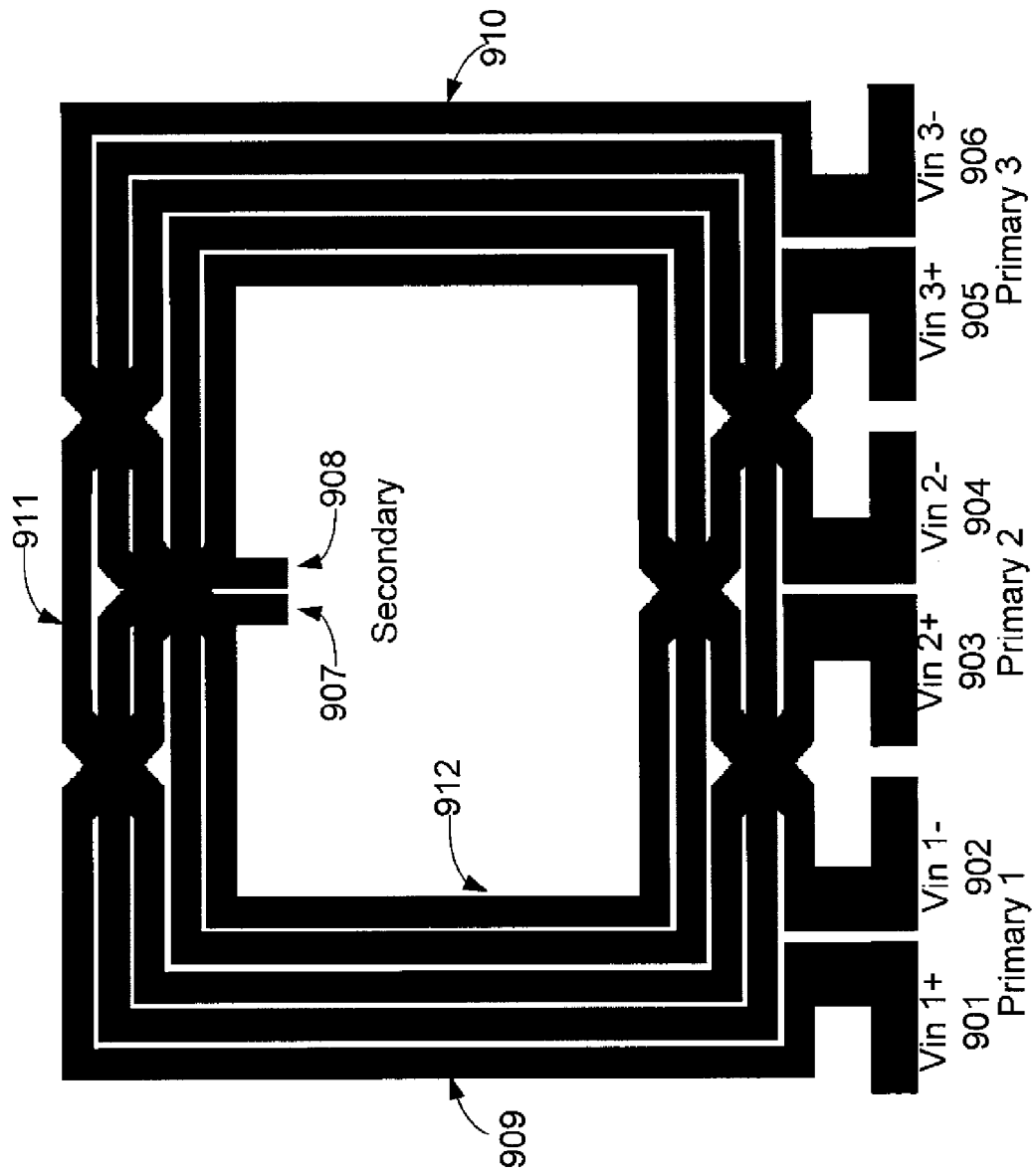

FIG. 9 is an example layout structure of an example transformer using three primary windings and a single secondary winding with the turn ratio from one primary winding to the single secondary winding being 1:2, according to an example embodiment of the invention.

Figure 10:
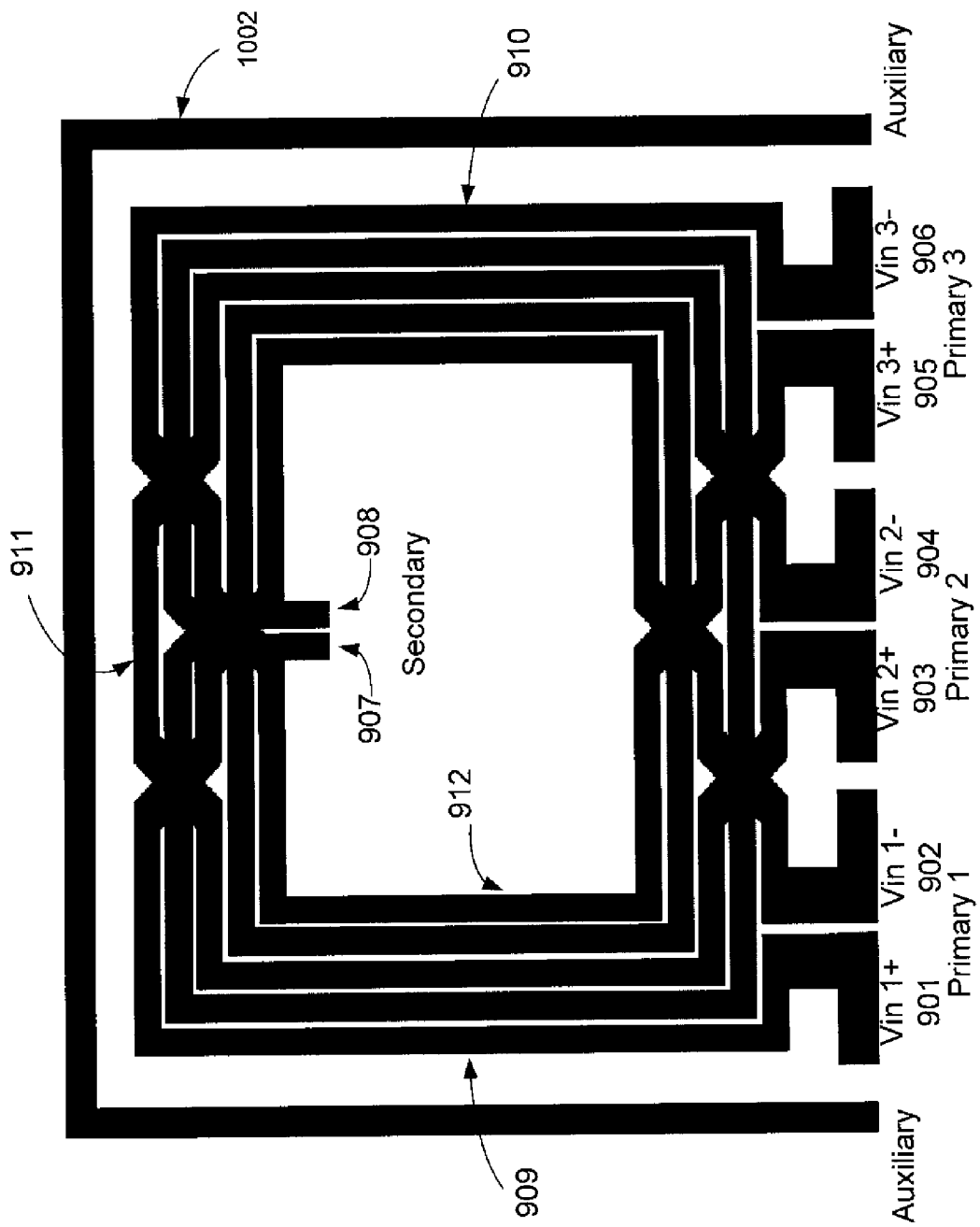

FIG. 10 illustrates an example layout structure for an example transformer that utilizes an auxiliary winding, according to an example embodiment of the invention.

Figure 11:
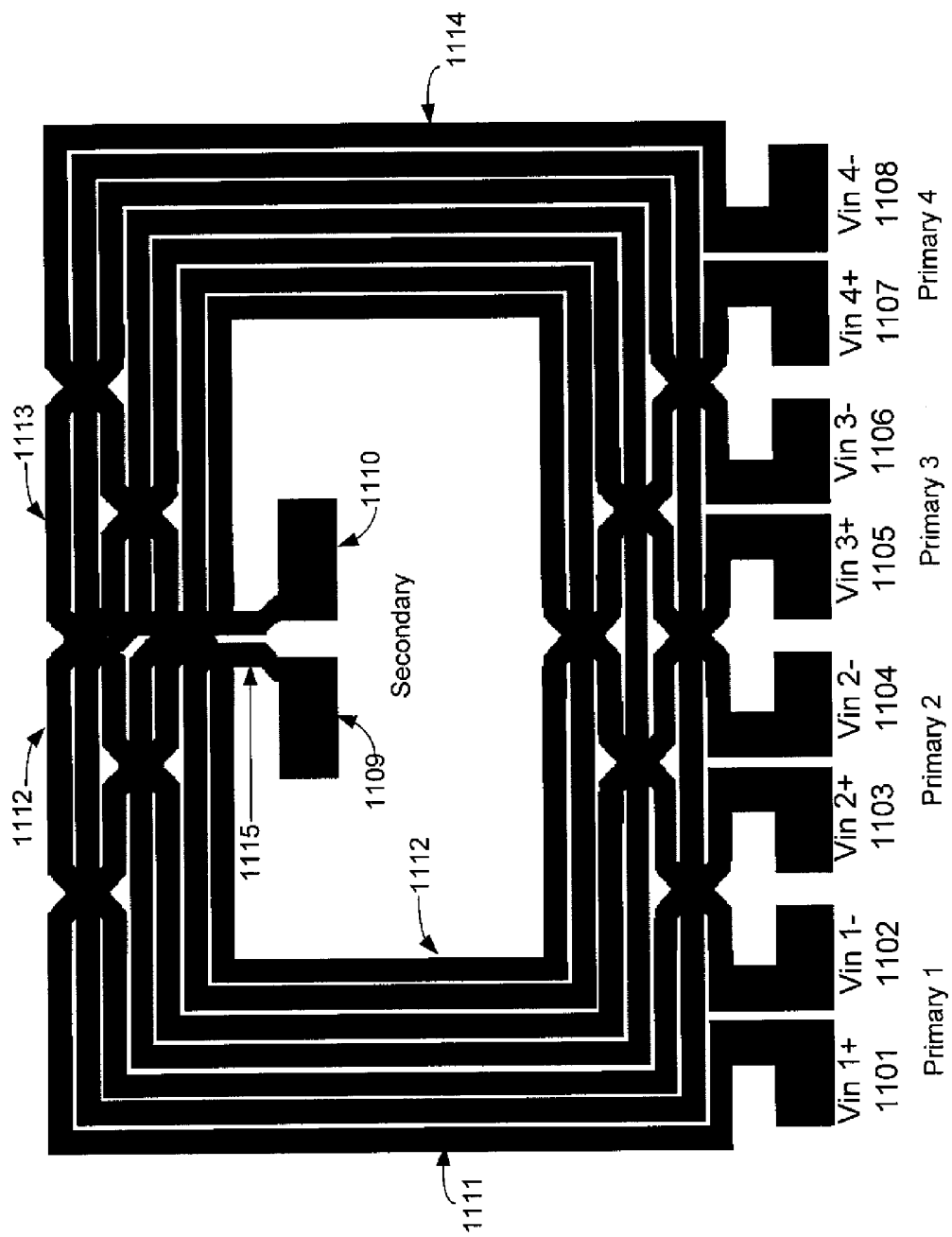

FIG. 11 is an example layout structure of an example transformer using four primary windings and a single secondary winding with the turn ratio from one primary winding to the single secondary winding being 1:3, according to an example embodiment of the invention.

Figure 12:
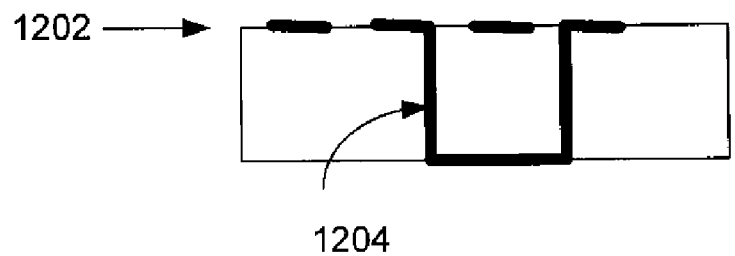

FIG. 12 illustrates an example planar substrate structure for implementing an example transformer, according to an example embodiment of the invention.

Figure 13:
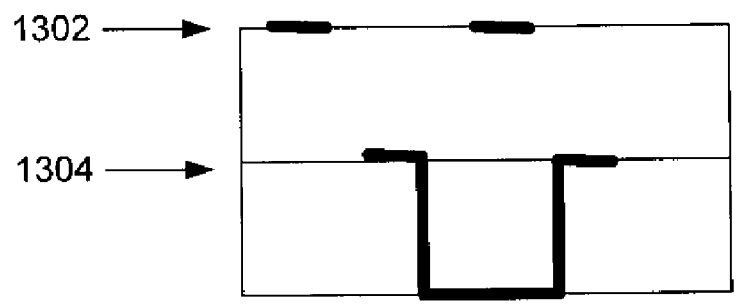
Figure 14:
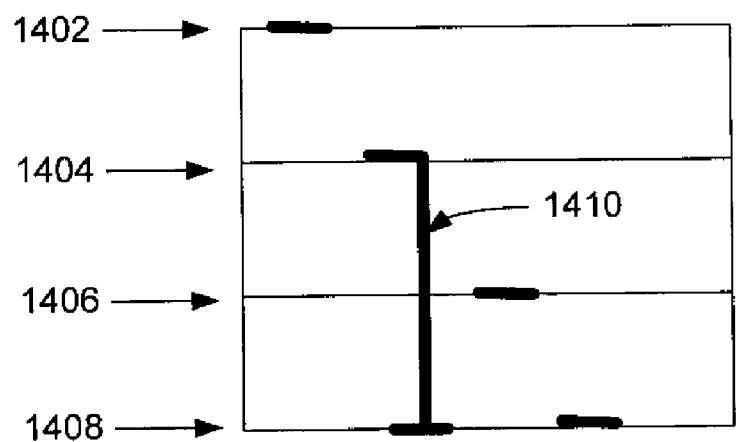

FIGS. 13 and 14 illustrate example stacked substrate structures for implementing example transformers, according to example embodiments of the invention.

Figure 15:
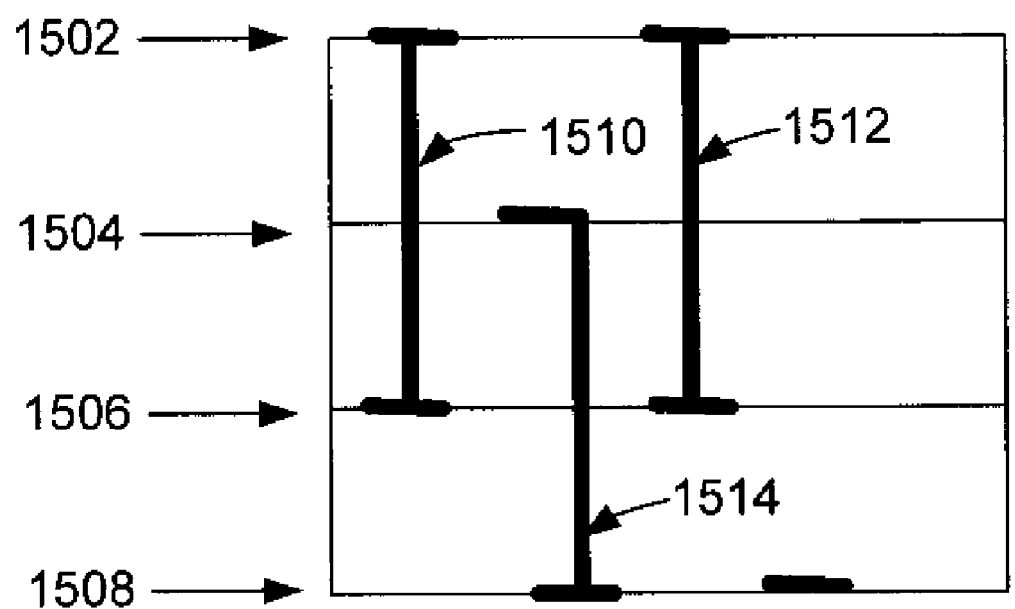

FIG. 15 illustrates an example multi-layer substrate structure for implementing an example transformer, according to an example embodiment of the invention.

Figure 16:
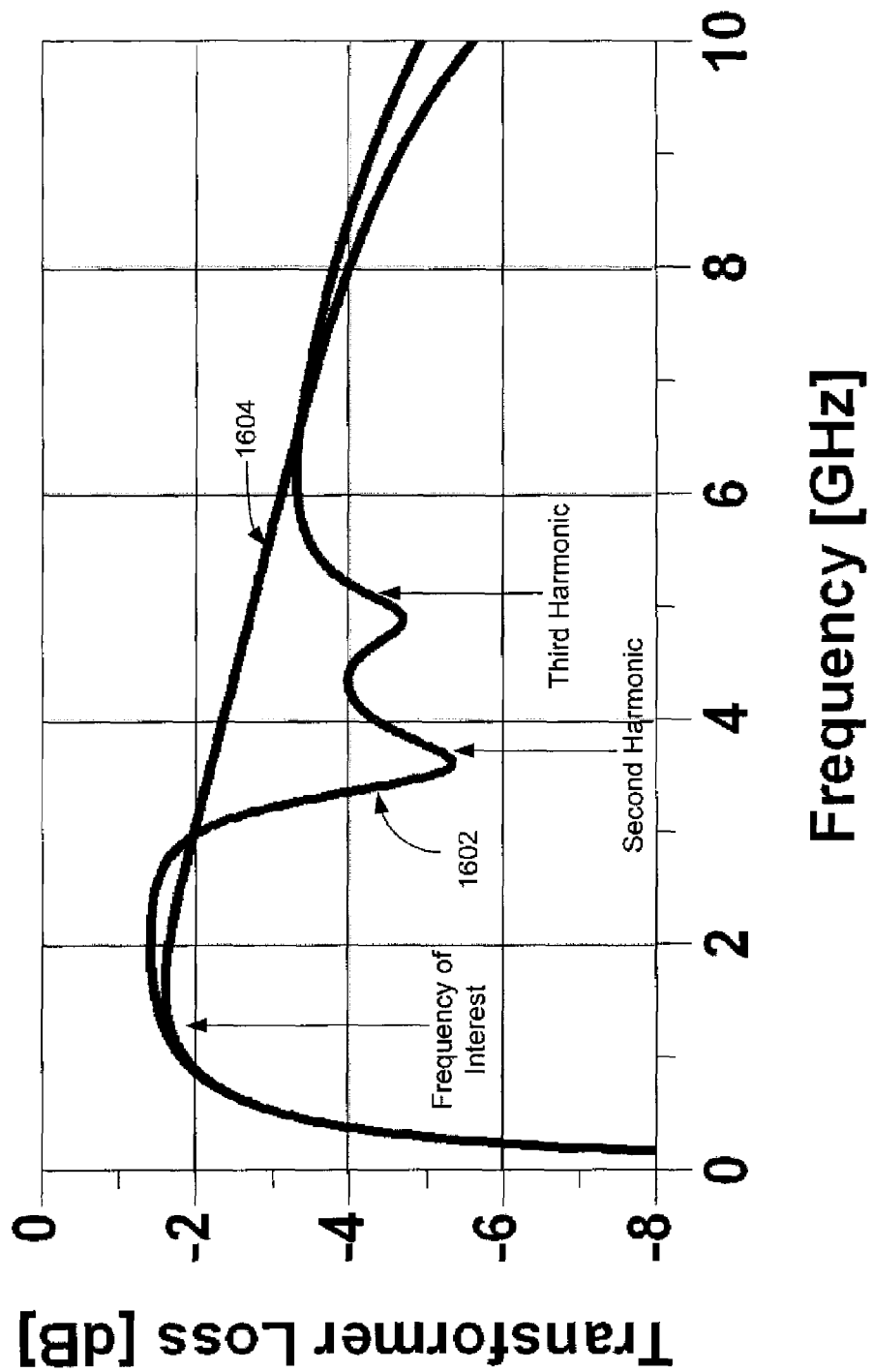

FIG. 16 illustrates example simulation results for an operation of an example transformer in accordance with an embodiment of the invention.

Figure 17:
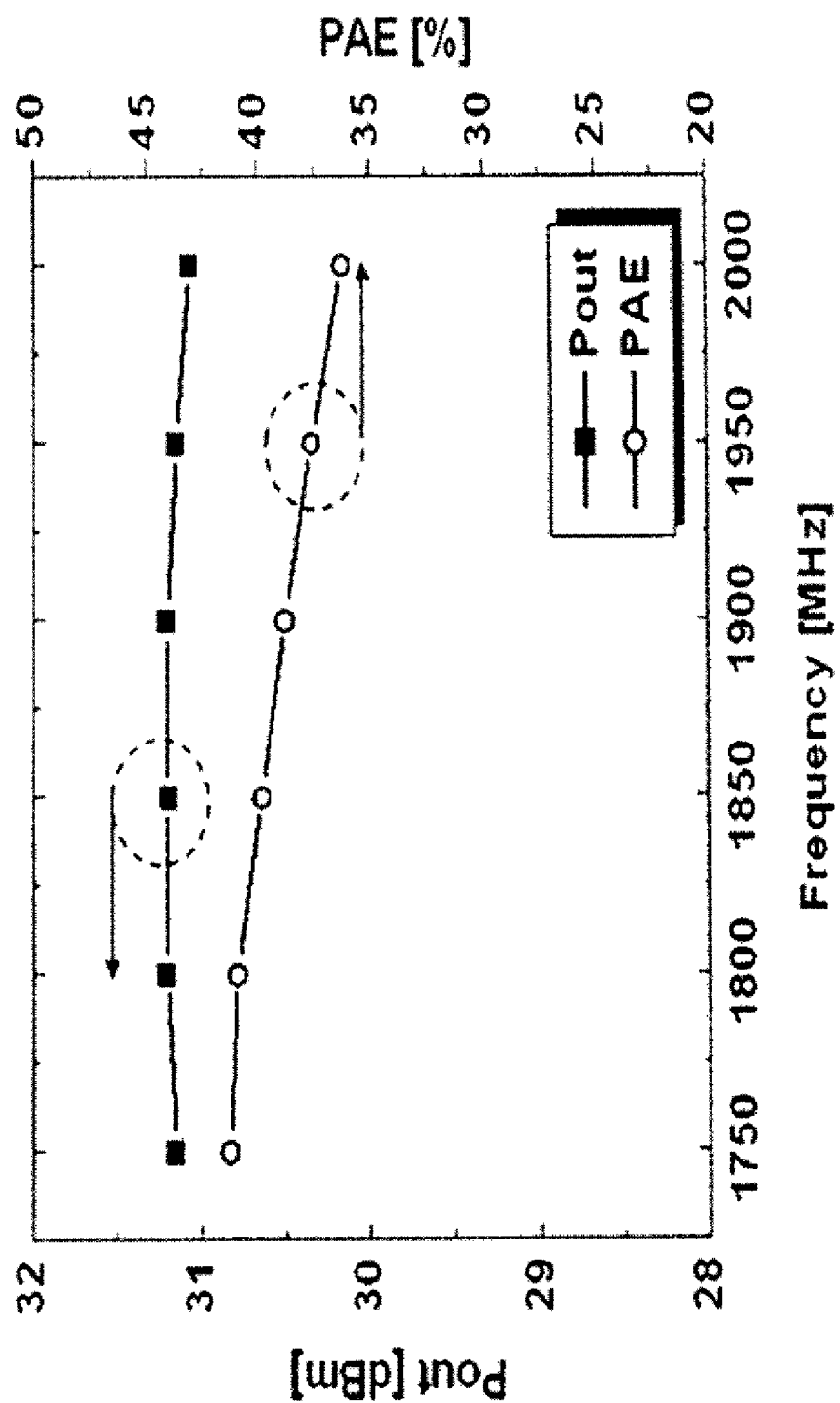

FIG. 17 illustrates example measured results for the operation of an example power amplifier utilizing example transformers in accordance with an embodiment of the invention.

DETAILED DESCRIPTION OF THE INVENTION

Example embodiments of the invention now will be described more fully hereinafter with reference to the accompanying drawings, in which some, but not all embodiments of the invention are shown. Indeed, these inventions may be embodied in many different forms and should not be construed as limited to the embodiments set forth herein; rather, these embodiments are provided so that this disclosure will satisfy applicable legal requirements. Like numbers refer to like elements throughout.

Example embodiments of the invention may provide for a power amplifier system, which may includes one or more amplifiers, a plurality of primary transformer windings having $N_1$ turns, and a single secondary transformer winding having $N_2$ turns. The turn ratio from each of the multiple of primary windings to the secondary winding may be $N_1:N_2$ with $N_1<N_2$, thereby boosting the voltage of each of the primary windings to the secondary winding in the ratio of substantially $N_2/N_1$, according to an example embodiment of the invention. Each amplifier may include a differential input that is commonly coupled to a system input port, and each of the primary windings may be coupled to the differential output of one of the multiple of amplifiers, according to an example embodiment of the invention. The single secondary transformer winding may be inductively coupled to the primary transformer windings and may provide a system output port to which one or more loads may be coupled.

FIG. 1A illustrates a circuit diagram of a voltage-boosting transformer in accordance with an example embodiment of the invention. In particular, the transformer in FIG. 1A may include a plurality of primary windings 113, 114 each having $N_1$ turn(s) and a single secondary winding 115 having $N_2$ turns. The primary windings 113, 114 may be inductively coupled to the single secondary winding 115. According to an example embodiment of the invention, the currents induced from each primary winding 113, 114 may be summed in the same phase at the secondary winding 115. The secondary winding 315 with $N_2$ turns may provide a system output port 116 (Vout) to which a load 117 (Rload) may be coupled. In an example embodiment of the invention, the load 117 may be a switch, a multiplexer, a filter, an antenna, or yet other loads. According to an example embodiment, the turns ratio from each of the plurality of primary windings 113, 114 to the secondary winding 115 may be $N_1:N_2$ with $N_1<N_2$ in order to boost the voltage from each of the primary windings 113, 114 to the secondary winding in the ratio of substantially $N_2/N_1$. In an example embodiment of the invention, where $N_2$ is 2 turns and $N_1$ is 1 turns, the turns ratio is ½, and the voltage at the single secondary winding 115 may be boosted by a factor of 2 compared to the voltage in each of the primary windings 113, 114.

Still referring to FIG. 1A, the primary windings 113, 114 may be connected to respective power amplifiers AMP1, AMP2, according to an example embodiment of the invention. The power amplifier AMP1 may include one or more inputs such as differential inputs 101 (Vin 1+) and 104 (Vin 1−), wherein input 101 may be a positive signal input and input 104 may be a negative signal input. Additionally, the amplifier AMP1 may include outputs such as outputs 109 and 110, wherein output 109 may be a positive output and output 110 may be a negative output. The outputs 109, 110 may be connected to the primary winding 113 of the transformer, according to an example embodiment of the invention.

Similarly, the power amplifier AMP2 may include one or more inputs such as differential inputs 105 (Vin 2+) and 108 (Vin 2−), wherein input 105 may be a positive signal input and input 108 may be a negative signal output. Likewise, the amplifier AMP 2 may include one or more outputs such as outputs 111 and 1112, wherein output 111 may be a positive output and output 112 may be a negative output. The outputs 111, 112 may be connected to the primary winding 114 of the transformer, according to an example embodiment of the invention.

According to an example embodiment of the invention, the current provided to the secondary winding from each amplifier AMP 1, AMP 2 may be substantially $i_1=N/M)\times i_2$, where $i_2$ is the current in the secondary winding, M is the number of primary windings 113, 114, and N is the turns ratio of each primary winding 113, 114 turns to the secondary winding 115 turns. Likewise, the voltage provided to the secondary winding 115 from each amplifier AMP1, AMP 2 may be substantially $v_1=(1/N)\times v_2$, where $v_2$ is the voltage in the secondary winding, and N is the turns ratio from each primary winding 113, 114 turns to the secondary winding 115 turns.

It will be appreciated that while only a single amplifier (e.g., AMP 1 or AMP 2) may be shown as being connected to respective primary windings 113, 114 in FIG. 1A, other example embodiments of the invention may include a plurality of amplifiers connected to a primary winding 113, 114. It will be appreciated that in some embodiments of the invention, the plurality of primary windings 113, 114 that are inductively coupled to the single secondary winding 115 may provide for impedance matching between the load 117 and the amplifiers AMP1, AMP 2.

FIG. 1B illustrates a voltage-boosting transformer that may be utilized with differential amplifiers, according to an example embodiment of the invention. In particular, as shown in FIG. 1B, a first amplifier may be comprised of transistors 102, 103 while a second amplifier may be comprised of transistors 106, 107, which may include Metal Oxide Semiconductor Field Effect-Transistors (MOSFETs), including Complementary Metal Oxide Semiconductor (CMOS) transistors. However, in another embodiment of the invention, these transistors 102 and 103 may also include Bipolar Junction Transistors (BJTs) or yet other types of transistors as well.

As shown in FIG. 1B, the source of transistor 102 may be connected to the source of transistor 103 and grounded, according to an example embodiment of the invention. The gate of transistor 102 may receive the positive signal input 101 while the gate of transistor 104 may receive the negative signal input 103. The drain of transistor 102 may provide for the positive output 109 while the drain of transistor 103 may provide for the negative output 110, according to an example embodiment of the invention. Likewise, the source of transistor 106 may be connected to the source of transistor 107 and grounded, according to an example embodiment of the invention. The gate of transistor 106 may receive the positive signal input 105 while the gate of transistor 107 may receive the negative signal input 108. The drain of transistor 106 may provide for the positive output 111 while the drain of transistor 108 may provide for the negative output 112, according to an example embodiment of the invention.

Still referring to FIG. 1B, each of the primary windings 113, 114 may each include respective center tap port 118, 119 corresponding to Vdd 1 and Vdd 2. The center tap port 118, 119 may be at virtual AC grounds when differential signals are generated by the respective first and second differential amplifiers for the respective primary windings 113, 114. The supply voltage of the differential amplifiers may be fed through the center tap ports 118, 119. According to an example embodiment of the invention, the positions of the center tap ports 118, 119 may correspond to a middle or symmetrical position of the respective primary windings 113, 114. However, in another example embodiment of the invention, the positions of the center tap ports 118, 119 may vary from a middle or symmetrical position depending on the magnitudes of the differential signals generated by the differential amplifiers.

FIG. 2A illustrates an example layout structure for an example transformer, according to an example embodiment of the invention. The transformer structure may include a plurality of primary windings in conjunction with a single secondary winding. Referring to FIG. 2, there may be two single-turn primary windings 213, 214 and a single two-turn secondary winding 215. The power amplifier AMP1 may receive inputs such as differential inputs 201 (Vin 1+), 204 (Vin 1−), and generate corresponding differential outputs 209, 210 for the first single-turn primary winding 213. Likewise, the power amplifier AMP 2 may receive inputs such as differential inputs 205 (Vin 2+), 208 (Vin 2−), and generate corresponding differential outputs 211, 212 for the second single-turn primary winding 214. According to an example embodiment of the invention, the flux or currents induced from each primary winding 213, 214 may be summed in the same phase at the secondary winding 215, according to an example embodiment of the invention. The two-turn secondary winding 215 may be connected a system output port 216 (Vout) to which a load 217 (Rload) may be coupled.

FIG. 2B illustrates an example layout structure for an example transformer that may be utilized with differential amplifiers, according to an example embodiment of the invention. As shown in FIG. 2, a first differential amplifier may be comprised of transistors 202 and 203, while a second differential amplifier may be comprised of transistors 206, 207. According to an example embodiment of the invention, the generation of differential outputs 209, 210 and 211, 212 by the differential amplifiers may result in an AC virtual ground being present at center tap ports 218, 219 in the respective primary windings 213, 214. According to an example embodiment of the invention, the supply voltage of the differential amplifiers may be provided through the ports 218, 219.

FIG. 3 illustrates a circuit diagram of an example transformer that utilizes one or more tuning blocks, according to an example embodiment of the invention. In particular, the circuit diagram of FIG. 3 illustrates two primary windings 113, 114 each with $N_1$ turns and a single secondary winding 115 with $N_2$ turns. The first primary winding 113 may be connected to one or more first power amplifiers, which may be comprised of transistors 102, 103, according to an example embodiment of the invention. Likewise, the second primary winding 114 may be connected to one or more second power amplifiers, which may be comprised of transistors 106, 107, according to an example embodiment of the invention. According an example embodiment of the invention, the transistors 102, 103, 106, 107 may be MOSFETs. However, in other example embodiments of the invention, the transistors 102, 103, 106, 107 may be BJTs or yet other types of transistors.

The first power amplifier comprised of transistors 102, 103 may be configured as a differential amplifier having a positive signal input 101 and a negative signal input 104, according to an example embodiment of the invention. Based upon the received signal inputs 101 and 104, the first differential amplifier may provide a corresponding positive output 109 and a corresponding negative output 110. The outputs 109, 110 may be connected to the first primary winding 113, according to an example embodiment of the invention. Similarly, the second power amplifier comprised of transistors 106, 107 may also be configured as a differential amplifier having a positive signal input 105 and a negative signal input 108, according to an example embodiment of the invention. Based upon the received signal inputs 105 and 108, the second differential amplifier may provide a corresponding positive output 111 and a corresponding negative output 112. The outputs 111, 112 may be connected to the second primary winding 114, according to an example embodiment of the invention.

According to an example embodiment of the invention, the two primary windings 113, 114 may be inductively coupled to the secondary winding 115. According to an example embodiment of the invention, the primary windings 113, 114 may each have N turn(s) while the secondary winding may have $N_2$ turns, where $N_2 > N_1$ in order to boost the voltage of the secondary winding compared to the primary windings 113, 114. The secondary winding may provide for a system output port 116 (Vout), which may be coupled, for example, to a load 117 (Rload).

According to an example embodiment of the invention, the use of differential amplifiers with the primary windings 118, 119 may provide for respective center tap ports 118, 119. According to an example embodiment of the invention, each center tap port 118, 119 may be at an virtual AC ground. The supply voltage for the differential amplifiers may be provided through the respective center tap ports 118, 119, according to an example embodiment of the invention. According to an example embodiment of the invention, a first tuning block 320 may be provided at center tap port 118 for the primary winding 118. Likewise, a second tuning block 321 may be provided at a center tap port 119 for the primary winding 114. The tuning blocks 320, 321 may be operative to control, adjust, filter, or otherwise tune the frequency bands of coupling, according to an example embodiment of the invention.

FIG. 4 illustrates an example layout structure for an example transformer utilizing one or more tuning blocks, according to an example embodiment of the invention. The transformer may include a plurality of primary windings that are inductively coupled to a secondary winding, according to an example embodiment of the invention. As shown in FIG. 4, there may be two primary windings 213, 214 each having a single turn ($N_1=1$), and a secondary winding 215 having two turns ($N_2=2$). The primary winding 213 may be connected to a first amplifier such as a differential amplifier comprised of transistors 202, 203 having a positive signal input 201 and a negative signal input 204. The first amplifier may provide for a positive output 209 and a negative output 210 to the primary winding 213. Likewise, the primary winding 214 may be connected to a second amplifier such as a differential amplifier comprised of transistors 206, 207 having a positive signal input 205 and a negative signal input 208. The second amplifier may provide for a positive output 211 and a negative output 212 to the primary winding 214.

According to an example embodiment of the invention, the generation of differential outputs 209, 210 and 211, 212 by the differential amplifiers may result in an AC virtual ground being present at center tap ports 218, 219 in the respective primary windings 213, 214. According to an example embodiment of the invention, the supply voltage of the differential amplifier may be provided through the ports 218, 219. According to an example embodiment of the invention, a first tuning block 420 may be connected to the first center tap port 218, while a second tuning block 421 may be connected to the second center tap port 219. It will be appreciated that the first and second tuning blocks 420, 421 may be fabricated as party of the same substrate(s) as the transformer structure or as discrete modules that are in communication with the transformer layout structure, according to an example embodiment of the invention.

The tuning blocks introduced in FIGS. 3 and 4 may be implemented in a variety of ways in accordance with example embodiments of the invention. According to an example embodiment of the invention, the tuning blocks may comprise resonant circuits. FIGS. 5A, 5B, and 5C illustrate some examples of resonant circuits that may be utilized as tuning blocks for the transformers, according to an example embodiment of the invention.

FIG. 5A is a schematic diagram of an example tuning block, according to an example embodiment of the invention. As shown in FIG. 5, the tuning block may be a resonant circuit comprised of a capacitive component 501 and an inductive component 502 connected in series, according to an example embodiment of the invention. The port 500 of the resonant circuit may be connected to a center tap port of a primary winding, according to an example embodiment of the invention. The resonant circuit of FIG. 5A may have an associated resonant frequency fn 503, according to an example embodiment of the invention.

FIG. 5B illustrates another schematic diagram of an example tuning block, according to an example embodiment of the invention. As shown in FIG. 5B, the tuning block may be a resonant circuit comprised of a capacitive component 511 in parallel with an inductive component 512. The port 510 of the resonant circuit may be connected to a center tap port of a primary winding, according to an example embodiment of the invention. The resonant circuit may have a resonant frequency fn 513, according to an example embodiment of the invention.

FIG. 5C illustrates another schematic diagram of an example tuning block, according to an example embodiment of the invention. As shown in FIG. 5C, there may be resonant circuit having a plurality of resonant frequencies such as resonant frequencies fn1 527, fn2 528, and fn3 528. For example, capacitive component 521 and inductive component 522 may be connected in series to provide resonant frequency fn1 527. Likewise, capacitive component 523 may be connected in series to inductive component 524 to provide resonant frequency fn2 528. Additionally, capacitive component 525 may be connected in series with inductive component 526 to provide resonant frequency fn3 529. It will be appreciated that while FIG. 5C illustrates a particular configuration for a resonant circuit, other embodiments of the invention may include varying types of series/parallel resonant circuits without departing from example embodiments of the invention. The port 520 of the resonant circuit may be connected to a center tap port of a primary winding, according to an example embodiment of the invention. Furthermore, while the tuning blocks are illustrated as being connected at the center tap ports, other embodiments of the invention may connect the tuning blocks to the primary windings in other locations as well.

It will be appreciated that the values and parameters of the capacitive and inductive components of FIGS. 5A-5C may be selected to have one or more desired resonant frequencies. According to an example embodiment of the invention, the one or more resonant frequencies of the tuning block may be operative to filter undesirable harmonics at the one or more resonant frequencies, thereby controlling the frequencies of coupling.

FIG. 6A illustrates an example embodiment of the invention in which a plurality of primary windings may be coupled to a single secondary winding. In particular, in FIG. 6A, there is illustrated n number of primary windings 616a-n each with $N_1$ turns. The n number of primary windings 616a-n may be inductively coupled to a single secondary winding 619 with $N_2$ turns, where $N_2 > N_1$. The output 610a-n, 611a-n of each differential power amplifier 607a-n may be connected to the respective input of primary windings 616a-n. In particular, the positive signal outputs 610a-n and the corresponding negative signal outputs 611a-n of the differential amplifiers may be connected the input of the respective primary windings 616a-n. The positive signal inputs 601a-n and the corresponding negative signal inputs 602a-n may be provided to the respective amplifiers such as differential amplifiers 607a-n. Each of the flux or currents induced by the multiple primary windings 616a-n may be summed in the same phase at the secondary winding 619, according to an example embodiment of the invention. The secondary winding 619 may provide a system output port 620 (Vout) to which a load 621 (Rload) may be coupled. Virtual AC grounds may be available at the center tap ports 622a-n where the differential signals of the respective differential amplifiers 607a-n induce to the primary winding. Therefore, the supply voltage of the differential amplifier may be fed through ports 622a-n. According to an example embodiment, tuning blocks, which may include resonant circuits as described herein, may also be provided at the center-tap ports 622a-n.

FIG. 6B illustrates an example embodiment of the invention in which a plurality of primary windings may be coupled to a single secondary winding. FIG. 6B illustrates that the amplifiers utilized with the transformers may be differential amplifiers. As shown in FIG. 6B, there may be a plurality of differential amplifiers connected to respective primary windings 616a-n. As shown in FIG. 6B, a first differential amplifier may be comprised of transistors 607a and 608a, according to an example embodiment of the invention. Likewise, a second differential amplifier may be comprised of transistors 607b and 608b. Similarly, the nth differential amplifier may be comprised of transistors 607n and 608n.

FIG. 7 illustrates a power amplifier system 700 that includes a transformer in accordance with an example embodiment of the invention. As shown in FIG. 7, the power amplifier system 700 may include a balun 750, a first stage driver amplifier 760, second stage driver amplifiers 770a and 770b, power amplifiers 780a and 780b, and an output transformer 790.

During operation of the power amplifier system 700, an input signal may be provided to the input port 701 of the balun 750. In an example embodiment of the invention, the balun 750 may be a transformer 702 (e.g., 3:4 turn transformer) for converting a single-ended input signal into differential signals 703, 704. It will be appreciated that the single-ended input signal may be baseband signal or a radio frequency signal in accordance with an example embodiment of the invention. According to an example embodiment of the invention, the balun 750 may also serve as a DC block. The first stage driver amplifier 760 may be an inverting amplifier that amplifies the differential signals 703, 704 to generate the amplified differential signals 706, 707. The amplified differential signals 706, 707 may be output from the first stage driver amplifier 760 and provide as inputs of the second stage driver amplifiers 770a, 770b, which then respectively generates amplified outputs 710, 711 and 712, 713. According to an example embodiment of the invention, the outputs 710, 711 and 712, 713 of the respective second stage driver amplifiers 508, 509 may then be provided to the power amplifiers 780a, 780b. The power amplifiers 780a, 780b may utilize a cascode topology in order to be more robust against susceptible voltage stress of submicron CMOS devices, according to an example embodiment of the invention. According to an example embodiment of the invention, the power amplifier 780a may include a stack of CMOS devices 714 and 715, which may be common-source CMOS transistors, according to an example embodiment of the invention. Additionally, the power amplifier 780a may also include CMOS devices 718, 719, which may be common-gate transistors, according to an example embodiment of the invention. Similarly, the power amplifier 780b may include a stack of CMOS devices 716, 717, which may be common-source transistors, according to an example embodiment of the invention. The power amplifier 780b may also include CMOS devices 720, 721, which may be common-gate transistors, according to an example embodiment of the invention. The outputs of the power amplifier 780a may be provided at outputs 722, 723 while the outputs of the power amplifier 780b may be provided at outputs 724, 725. The gain provided by the power amplifiers 780a, 780b may be adjusted at the power amplifier (PA) control port 732, which may provide a bias voltage to the gates of the common-gate transistors 718, 719 and 720, 721, according to an example embodiment of the invention.

Still referring to FIG. 7, the primary windings 726, 727 of the output transformer 790 may be connected to the respective outputs 722, 723 and 724, 725. Using the transformer 790, the output powers provided to each of the primary windings 726, 727 may be inductively combined at the secondary winding 728. According to an example embodiment of the invention, each primary winding 726, 727 may have $N_1$ turn(s) while the secondary wining 728 may have $N_2$ turns, with $N_2 > N_1$ to boost the voltage at the secondary winding 728. The primary windings 726, 727 may be positioned, perhaps in parallel, to add flux or currents in the same phase in the secondary winding 728, according to an example embodiment of the invention. The central tap ports 730 and 731 may be the virtual AC ground when the differential signals of the differential amplifiers such as amplifiers 780a, 780b are provided to the primary windings 726, 727. Therefore, according to an example embodiment of the invention, the supply voltage of the differential amplifier may be fed through the ports 730, 731. Additionally or alternatively, one or more tuning blocks as described herein may likewise be provided at the center tap ports 730, 731. According to an example embodiment of the invention, the transformer 790 may be fabricated on a silicon substrate, although other substrates may be utilized without departing from embodiments of the invention.

Example Embodiments of Transformer Layout Structures

FIGS. 8-11 illustrate a variety of example layout structures for implementing voltage-boosting transformers in accordance with example embodiments of the invention. According to an example embodiment of the invention, the primary transformer windings and the single secondary transformer winding may be spatially interweaved on a substrate to reduce the total area of the transformer.

FIG. 8 illustrates an example layout structure of a transformer that may include two one-turn primary windings 807, 808 and a single two-turn secondary winding 809, according to an example embodiment of the invention. In FIG. 8, two single-turn primary windings 807, 808 and a single two-turn secondary winding 809 may be utilized to combine currents from two differential pairs of positive ports positive ports 801, 803 and respective negative ports 802, 804. According to an example embodiment of the invention, magnetically induced currents by excitation of two primary windings 807, 808 may be added together at the secondary winding 809 in the same phase. The transformer may be designed such that the currents of primary windings 807, 808 are in the same direction to prevent self-cancellation, according to an example embodiment of the invention.

FIG. 9 illustrates an example layout structure of a transformer that may include three one-turn primary windings 909, 910, 911 and a single two-turn secondary winding 912, according to an example embodiment of the invention. The three one-turn primary windings 909, 910, 911 and the and single two-turn secondary winding 912 may be utilized to combine currents from three differential pairs of positive ports 901, 903, 905 and corresponding negative ports 902, 904, 906. Magnetically induced currents by excitation of three primary windings 909, 910, 911 may be added together at the secondary winding 912 in the same phase, according to an embodiment of the invention. The transformer may be designed such that the currents of primary windings 909, 910, 911 are in the same direction to prevent self-cancellation, according to an example embodiment of the invention.

FIG. 10 illustrates an example layout structure of a transformer of an example power amplifier system with an auxiliary winding adjacent to or substantially encapsulating a portion of the transformer, according to an example embodiment of the invention. In particular, FIG. 10 illustrates the example layout structure for a transformer of FIG. 9 with an additional auxiliary winding 1002. According to an example embodiment of the invention, the auxiliary winding 1002 may be coupled to a transformer to sense an amount of coupling between the primary windings 909, 910, 911 and the secondary winding 912. It will be appreciated that while the auxiliary winding 1002 illustrated in FIG. 10 may be varied according to example embodiments of the invention. For example, an auxiliary winding for power sensing may be placed adjacent to one side of a transformer to sense an amount of coupling. According to another example, an auxiliary winding for power sensing may be placed adjacent to one side or a plurality of sides of a transformer to sense an amount of coupling. Furthermore, while an auxiliary winding has been illustrated with respect to an example transformer of FIG. 9, the auxiliary winding is likewise application to other transformers, including those described herein, according to example embodiments of the invention.

FIG. 11 illustrates an example physical layout of a transformer that includes four one-turn primary windings 1111, 1112, 1113, 1114 and a single three-turn secondary winding 1115. Four single-turn primary windings 1111, 1112, 1113, 1114 and a single three-turn secondary winding 1115 may be employed to combine currents from four differential pairs with positive ports 1101, 1103, 1105, 1107 and corresponding negative ports 1102, 1104, 1106, 1108. Magnetically induced currents by excitation of four primary windings 1111, 1112, 1113, 1114 may be added together at the secondary winding 1115 in the same phase, according to an example embodiment of the invention. The transformer may be designed such that the currents of primary windings may be in the same direction to prevent self-cancellation.

It will be appreciated that transformers in accordance with embodiments of the invention may include a plurality of primary windings with $N_1$ turns and a single secondary winding with $N_2$ turns. According to an example embodiment of the invention, $N_2 > N_1$ in order to boost the voltage at the secondary winding. While FIGS. 8-11 have illustrated example transformers with 2, 3, or 4 primary windings, it will be appreciated that other embodiments of the invention may include more primary windings than those shown in FIGS. 8-11.

According to an example embodiment of the invention, the layouts for the transformers described herein may be implemented utilizing a planar structure, stacked structure, or a multi-layer structure. With a planar structure, all of the primary windings may be placed in parallel. However, a secondary winding with multiple turns may be placed between one of the primary windings and another one of the primary windings such that one primary winding does not neighbor another primary winding. For example, as shown in the example planar substrate structure of FIG. 12, a first primary winding may be fabricated entirely on first metal layer 1202 while a second primary winding may also be fabricated substantially on the same first metal layer 1202, with cross-over/interleaved sections being routed using one or more via connections 1204. Likewise, a secondary multi-turn winding may also be fabricated substantially on the surface between the primary windings, with cross-over sections being routed using one or more via connections 1204.

According to another example embodiment of the invention, the layouts for the transformers may be implemented utilizing a stacked structure. With an example stacked structure, all of the primary windings may be placed in parallel and neighboring each other on one of metal layer, and the secondary winding may be placed in another metal layer. For example, in the stacked substrate structure of FIG. 13, the primary windings may be formed on metal layer 1302 while the secondary winding may be formed on metal layer 1304, according to an example embodiment of the invention.

According to another example embodiment of the invention, the multi-primary transformer may be implemented in another stacked structure, where each primary winding may be placed in parallel in each different layer, but the layers of the primary windings may not be vertically neighboring each other, wherein the secondary winding with multiple turns may be placed between one layer of the primary windings and another layer of primary windings, wherein the multiple turns of the secondary winding may occupy multiple layers connected with vias. For example, in the example stacked substrate structure of FIG. 14, a first primary winding may be formed on metal layer 1402 while a second primary winding may be formed on another metal layer 1406. The single secondary winding having multiple turns may be formed using a combination of metal layers 1404 and 1408 and connected by at least one via 1410, according to an example embodiment of the invention.

According to another example embodiment of the invention, the multi-primary transformer may be implemented in a multi-layer structure. With the multilayer structure, each primary winding may be fabricated using two or more layers and connected by vias. Likewise, the secondary winding may be fabricated using two or more layers and connected by vias. For example, as shown in FIG. 15, a first primary winding may be fabricated on a first part of the first metal layer 1502 and a first part of the third metal layer 1506 and connected by at least one first via 1510. Similarly, a second primary winding may be fabricated on a second part of the first metal layer 1502 and a second part of the third metal layer 1506 and connected by at least one second via 1512. According to an example embodiment of the invention, the single secondary winding may be fabricated on the second metal layer 1504 and the fourth metal layer 1508 and connected by at least one third via 1508.

In accordance with an embodiment of the invention, the core of the power amplifiers and the transformer windings may be spatially separated from each other to reduce the magnetic coupling from the transformer to the core of the power amplifiers and thereby reduce the possibility of instability. In accordance with another embodiment of the invention, the spatially separated transformer from the core of the power amplifiers may be implemented on a separate substrate provided by a different technology. Accordingly, the transformer and the power amplifiers need not be limited to a single fabrication technology. According to another embodiment of the invention, the spatially interweaved transformer may be compact in size. Many other variations of the transformers and power amplifiers are available without departing from embodiments of the invention.

EXAMPLE SIMULATION AND EXPERIMENTAL RESULTS

FIG. 16 illustrates example simulation results for an operation of an example transformer in accordance with an embodiment of the invention. Specifically, the simulation results illustrate the transformer loss(dB) as a function of frequency (GHz) As shown in FIG. 16, graph 1602 illustrates a transformer utilizing center-tap tuning while graph 1604 illustrates a transformer without utilizing center-tap tuning. In both cases, the transformers show a lower loss at the fundamental frequency of operation than at high harmonic frequencies. In the case of the transformer utilizing center-tap tuning, there is a higher loss at the second and third harmonic frequencies.

FIG. 17 illustrates example measured results for the operation of an example power amplifier utilizing example transformers in accordance with an embodiment of the invention. These measurement results illustrate the output power and the power added efficiency of such an example power amplifier. As shown in FIG. 17, the measured results meet the demand of the power amplifier capability in the frequency range between 1700 MHz~2000 MHz. An output power of 31.2 dBm at 1.8 GHz and the corresponding power added efficiency 41% was obtained with a 3.3 V power supply.

Many modifications and other embodiments of the inventions set forth herein will come to mind to one skilled in the art to which these inventions pertain having the benefit of the teachings presented in the foregoing descriptions and the associated drawings. Therefore, it is to be understood that the inventions are not to be limited to the specific embodiments disclosed and that modifications and other embodiments are intended to be included within the scope of the appended claims. Although specific terms are employed herein, they are used in a generic and descriptive sense only and not for purposes of limitation.

What is claimed is:

1. A power amplifier system, comprising:
a plurality of power amplifiers, wherein each power amplifier includes at least one output port;
a plurality of primary windings each having a first number of turns, wherein each primary winding is connected to at least one output port of the plurality of power amplifiers, and wherein each of the plurality of primary windings includes a center-tap port for connecting one or more electrical components, wherein the one or more electrical components comprise at least one voltage supply or at least one tuning block, wherein the at least one tuning block includes one or more resonant circuits; and a single secondary winding inductively coupled to the plurality of primary windings, wherein the secondary winding includes a second number of turns greater than the first number of turns.

2. The system of claim 1, wherein the center-tap port includes an AC virtual ground.

3. The system of claim 1, wherein the one or more resonant circuits includes one or more capacitive components and one or more inductive components that are connected in series or parallel.

4. The system of claim 1, wherein the at least one tuning block utilizes the resonant circuits to selectively enhance or suppress one or more frequency components.

5. The system of claim 1, wherein the primary windings are arranged relative to the single secondary winding such that flux or currents induced by the primary windings in the secondary winding are summed in phase.

6. The system of claim 1, wherein the single secondary winding is interleaved between primary windings having a same current flow direction, and wherein the plurality of primary windings and the single secondary winding are fabricated using a (i) planar structure, (ii) a stacked structure, or (iii) a multi-layer structure.

7. The system of claim 6, wherein the plurality of primary windings and the single secondary winding are fabricated using a planar structure having a metal layer, wherein the plurality of the primary windings are fabricated on the metal layer as parallel primary windings, and wherein the secondary winding is fabricated on the metal layer and positioned between adjacent primary windings of the plurality of primary windings.

8. The system of claim 6, wherein the plurality of primary windings and the single secondary winding are fabricated using a stacked structure having a first metal layer and a second metal layer opposite the first metal layer, wherein the plurality of primary windings are fabricated on the first metal layer, and the single secondary winding is fabricated on the second metal layer.

9. The system of claim 6, wherein the plurality of primary windings and the single secondary winding are fabricated using a stacked structure having a first metal layer, a second metal layer, a third metal layer, and a fourth metal layer, wherein the first and second metal layers sandwich the third metal layer, and wherein the third metal layer and the fourth metal layer sandwich the second metal layer, and wherein a first primary winding of the plurality of primary windings is fabricated on the first metal layer, a second primary winding of the plurality of primary windings is fabricated on the second metal layer, and the single secondary winding is fabricated on the third metal layer and the fourth metal layer, wherein the third metal layer and the fourth metal layer are connected by at least one via.

10. The system of claim 6, wherein the plurality of primary windings and the single secondary winding are fabricated using a multi-layer structure having a first metal layer, a second metal layer, a third metal layer, and a fourth metal layer, wherein the first and second metal layers sandwich the third metal layer, and wherein the third metal layer and the fourth metal layer sandwich the second metal layer, wherein a first primary winding of the plurality of primary windings is fabricated on a first part of the first metal layer and a first part of the second metal layer, wherein the first part of the first metal layer and the first part of the second metal layer are connected by at least one first via, wherein a second primary winding of the plurality of primary windings is fabricated on a second part of the first metal layer and a second part of the second metal layer, wherein the second part of the first metal layer and the second part of the second metal layer are connected by at least one second via, and wherein the single secondary winding is fabricated on the third metal layer and the fourth metal layer, wherein the third metal layer and the fourth metal layer are connected by at least one third via.

11. The system of claim 1, wherein the plurality of primary windings and the single secondary winding form a transformer, and further comprising an auxiliary winding that is adjacent to one or more sides of the transformer to sense an amount of coupling between the plurality of primary windings and the single secondary winding.

12. A method for providing a power amplifier system, comprising:
providing a plurality of power amplifiers, wherein each power amplifier includes at least one output port;
connecting the at least one output port of each power amplifier to one of a plurality of primary windings, wherein each of the plurality of windings includes a first number of turns, and wherein each of the plurality of primary windings includes a center-tap port for connecting one or more electrical components, wherein the one or more electrical components comprise at least one voltage supply or at least one tuning block, wherein the at least one tuning block includes one or more resonant circuits; and
inductively coupling the plurality of primary windings to a single secondary winding, wherein the secondary winding includes a second number of turns greater than the first number of turns.

13. The method of claim 12, wherein the center-tap port includes an AC virtual ground.

14. The method of claim 12, wherein the one or more resonant circuits includes one or more capacitive components and one or more inductive components that are connected in series or parallel.

15. The method of claim 12, wherein the at least one tuning block utilizes the resonant circuits to selectively enhance or suppress one or more frequency components.

16. The method of claim 12, wherein the single secondary winding is interleaved between primary windings having a same current flow direction, and wherein the plurality of primary windings and the single secondary winding are fabricated using a (i) planar structure, (ii) a stacked structure, or (iii) a multi-layer structure.

17. The method of claim 16, wherein the plurality of primary windings and the single secondary winding are fabricated using a planar structure having a metal layer, and further comprising fabricating the plurality of primary windings on the metal layer as parallel primary windings, and fabricating the secondary winding on the metal layer such that the secondary winding is positioned between adjacent primary windings of the plurality of primary windings.

18. The method of claim 16, wherein the plurality of primary windings and the single secondary winding are fabricated using a stacked structure having a first metal layer and a second metal layer opposite the first metal layer, and further comprising fabricating the plurality of primary windings on the first metal layer, and fabricating the single secondary winding on the second metal layer.

19. The method of claim 16, wherein the plurality of primary windings and the single secondary winding are fabricated using a stacked structure having a first metal layer, a second metal layer, a third metal layer, and a fourth metal layer, wherein the first and second metal layers sandwich the third metal layer, and wherein the third metal layer and the fourth metal layer sandwich the second metal layer, and further comprising:

fabricating a first primary winding of the plurality of primary windings on the first metal layer;

fabricating a second primary winding of the plurality of primary windings on the second metal layer; and fabricating the single secondary winding on the third and fourth metal layers, wherein the third and fourth metal layers are connected by at least one via.

20. The method of claim 16, wherein the plurality of primary windings and the single secondary winding are fabricated using a multi-layer structure having a first metal layer, a second metal layer, a third metal layer, and a fourth metal layer, wherein the first and second metal layers sandwich the third metal layer, and wherein the third metal layer and the fourth metal layer sandwich the second metal layer, and further comprising:

fabricating a first primary winding of the plurality of primary windings on a first part of the first metal layer and a first part of the second metal layer, wherein the first part of the first metal layer and the first part of the second metal layer are connected by at least one first via;

fabricating a second primary winding of the plurality of primary windings on a second part of the first metal layer and a second part of the second metal layer, wherein the second part of the first metal layer and the second part of the second metal layer are connected by at least one second via; and fabricating the single secondary winding on the third and fourth metal layers, wherein the third and fourth metal layers are connected by at least one third via.

21. The method of claim 12, wherein the plurality of primary windings and the single secondary winding form a transformer, and further comprising:

positioning an auxiliary winding adjacent to one or more sides of the transformer to sense an amount of coupling between the plurality of primary windings and the single secondary winding.

\* \* \* \* \*